(12) United States Patent
Hohl et al.

(10) Patent No.: US 9,976,405 B2
(45) Date of Patent: May 22, 2018

(54) METHOD TO MITIGATE BIT INDUCED VIBRATIONS BY INTENTIONALLY MODIFYING MODE SHAPES OF DRILL STRINGS BY MASS OR STIFFNESS CHANGES

(71) Applicants: Andreas Hohl, Hannover (DE); Mathias Tergeist, Celle (DE); Hatem Oueslati, Hannover (DE); Christian Herbig, Celle (DE); Jayesh J. Jain, The Woodlands, TX (US); Hanno Reckmann, Nienhagen (DE); Lance A. Endres, Spring, TX (US)

(72) Inventors: Andreas Hohl, Hannover (DE); Mathias Tergeist, Celle (DE); Hatem Oueslati, Hannover (DE); Christian Herbig, Celle (DE); Jayesh J. Jain, The Woodlands, TX (US); Hanno Reckmann, Nienhagen (DE); Lance A. Endres, Spring, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 1069 days.

(21) Appl. No.: 14/070,130

(22) Filed: Nov. 1, 2013

(65) Prior Publication Data
US 2015/0122547 A1 May 7, 2015

(51) Int. Cl.
*E21B 44/02* (2006.01)
*G06F 17/50* (2006.01)

(52) U.S. Cl.
CPC .......... *E21B 44/02* (2013.01); *G06F 17/5086* (2013.01)

(58) Field of Classification Search
CPC .......... E21B 7/00; E21B 44/02; E21B 49/003; G06F 17/5086
See application file for complete search history.

(56) References Cited

U.S. PATENT DOCUMENTS

| | | | |
|---|---|---|---|
| 5,402,677 A | 4/1995 | Paslay et al. | |
| 6,119,404 A | 9/2000 | Bschorr et al. | |
| (Continued) | | | |

OTHER PUBLICATIONS

J.R. Bailey & S.M. Remmert "Managing Drilling Vibrations Through BHA Design Optimization" SPE Drilling & Completion, vol. 25, issue 4, pp. 458-471 (2010) available at <https://www.onepetro.org/journal-paper/SPE-139426-PA>.*

(Continued)

*Primary Examiner* — Jay B Hann
(74) *Attorney, Agent, or Firm* — Cantor Colburn LLP

(57) ABSTRACT

A method for reducing drill tubular vibrations includes: constructing a mathematical model the drill tubular having mass distribution, material stiffness and material damping; constructing an equation of motion of the drill tubular in one of a time domain and frequency domain; transforming the equation of motion into a modal domain equation of motion to provide a mode shape of the drill tubular at an eigenfrequency, the mode shape providing an amplitude at a position along the drill tubular; comparing the amplitude at the position along the drill tubular to a threshold amplitude value; modifying at least one of the mass distribution, material stiffness and material damping if the amplitude exceeds the threshold value; and iterating the above step until at least one of the amplitude of the latest mode shape at the position is less than or equal to the threshold amplitude value and a predetermined constraint limits the modifying.

19 Claims, 6 Drawing Sheets

(56) References Cited

U.S. PATENT DOCUMENTS

| | | | |
|---|---|---|---|
| 6,785,641 B1* | 8/2004 | Huang | E21B 44/00 703/7 |
| 7,251,590 B2 | 7/2007 | Huang et al. | |
| 7,748,474 B2 | 7/2010 | Watkins et al. | |
| 7,828,082 B2 | 11/2010 | Pabon et al. | |
| 8,214,188 B2 | 7/2012 | Bailey et al. | |
| 8,401,831 B2 | 3/2013 | Tang et al. | |
| 8,504,342 B2 | 8/2013 | Bailey et al. | |
| 8,589,136 B2* | 11/2013 | Ertas | E21B 7/00 703/10 |
| 2011/0077924 A1 | 3/2011 | Ertas et al. | |
| 2011/0186353 A1 | 8/2011 | Turner et al. | |
| 2011/0245980 A1 | 10/2011 | Nessjoen et al. | |
| 2012/0123757 A1 | 5/2012 | Ertas et al. | |
| 2012/0130693 A1 | 5/2012 | Ertas et al. | |
| 2015/0275648 A1* | 10/2015 | Wang | E21B 44/00 702/9 |

OTHER PUBLICATIONS

Duff, "An Experimental and Computational Investigation of Rotating Flexible Shaft System Dynamics in Rotary Drilling . . . " Dissertation, Louisiana State University and Agricultural and Mechanical College; Aug. 2013; 184 pages.

Khulief et al., "Laboratory investigation of drillstring vibrations", Department of Mechanical Engineering, King Fahd University of Petroleum and Minerals, Dhahran, Saudi Arabia; Received Feb. 2, 2009; accepted for publication Apr. 28, 2009; 15 pages.

Khulief et al., "Vibration analysis of drillstrings with self-excited stick-slip oscillations", Department of Mechanical Engineering, King Fahd University of Petroleum and Minerals, Dhahran 31261, Saudi Arabia, Oct. 2005, doi:10.1016/j.jsv.2006.06.06; 19 pages.

Sahebkar et al., "Nonlinear vibration analysis of an axially moving drillstring system withtime dependent axial load and axial velocity in inclined well", Department of Mechanical Engineering, School of Engineering, Tarbiat Modares University, Tehran; received Feb. 8, 2009; available online Jan. 20, 2011; pp. 743-760.

Xiaohua Zhu,Weiji Liu, "Research on the effect of drill string impact on wellbore stability", Journal of Petroleum Science and Engineering, http://dx.doi.org/10.1016/j.petrol.2013.08.004, 30 pages.

Notification of Transmittal of the International Search Report and the Written Opinion of the International Searching Authority, or the Declaration: PCT/US2014/063410; dated Feb. 12, 2015; 9 pages.

* cited by examiner

METHOD TO MITIGATE BIT INDUCED VIBRATIONS BY INTENTIONALLY MODIFYING MODE SHAPES OF DRILL STRINGS BY MASS OR STIFFNESS CHANGES

BACKGROUND

Boreholes are drilled into earth formations for various purposes such as hydrocarbon production, geothermal production, and carbon dioxide sequestration. In general, the boreholes are drilled by rotating a drill bit disposed at the distal end of a string of drill pipes referred to as a drill string. An assembly of the drill bit and other downhole tools at the end of the drill string may be referred to as a bottomhole assembly (BHA). Applying forces to the drill string to drill a borehole may result in vibratory behavior of the drill string and the BHA.

Different kinds of vibratory behavior exist in oil field drilling dynamics. These can be distinguished into axial, torsional, and lateral vibrations. Recently, high frequency torsional vibrations were observed in field tests with accelerations up to 100 g, which are potentially able to damage downhole tools. These vibrations can also be differentiated from stick slip by mode shapes, which are localized to the BHA. Hence, it would be well received in the drilling and geophysical exploration industries if a method could be developed to reduce high frequency vibrations of the drill string and BHA.

BRIEF SUMMARY

Disclosed is a method for reducing vibrations in a drill tubular coupled to a drill bit configured to drill a borehole in a formation. The method includes: constructing a mathematical model of a system comprising the drill tubular, the mathematical model comprising mass distribution, material stiffness and material damping; constructing an equation of motion of the drill tubular in one of a time domain and frequency domain using the mathematical model and a force model of a force applied to the drill tubular while the drill bit is cutting the formation; transforming the equation of motion describing motion of the drill tubular into a modal domain equation of motion to provide a mode shape of the drill tubular at an eigenfrequency, the mode shape providing an amplitude at a position along the drill tubular; comparing the amplitude at the position along the drill tubular to a threshold amplitude value; modifying at least one of the mass distribution, material stiffness and material damping if the amplitude exceeds the threshold amplitude value; and iterating the steps of constructing a mathematical model, constructing an equation of motion, transforming the equation of motion, and modifying until at least one of (i) the amplitude of the latest mode shape at the position is less than or equal to the threshold amplitude value and (ii) a predetermined constraint limits the modifying.

BRIEF DESCRIPTION OF THE DRAWINGS

The following descriptions should not be considered limiting in any way. With reference to the accompanying drawings, like elements are numbered alike.

DETAILED DESCRIPTION

A detailed description of one or more embodiments of the disclosed apparatus and method presented herein by way of exemplification and not limitation with reference to the figures.

Disclosed is a method for reducing vibrations in a drill string induced by cutting forces from interaction of a drill bit with an earth formation being drilled. The method is explained using the example of self-excited vibrations due to a falling characteristic of the aggressiveness of the drill bit with respect to the angular velocity of the drill bit or drill string. Nevertheless, the method is also able to reduce vibrations in specific mode shapes, which are induced by any kind of cutting force at the drill bit (e.g., harmonic excitation forces and impacts). The method involves modifying vibratory mode shapes of the drill string, which includes a bottomhole assembly (BHA). The vibratory mode shapes may be modified by changing the distribution of mass, density of mass, structural or material stiffness, and/or damping characteristic of the drill string and/or BHA. While torsional vibrations and bit-rock interactions are discussed for teaching purposes, the method may be applied to other types of vibrations and any other source of self-excitation or excitation.

Figure 1:
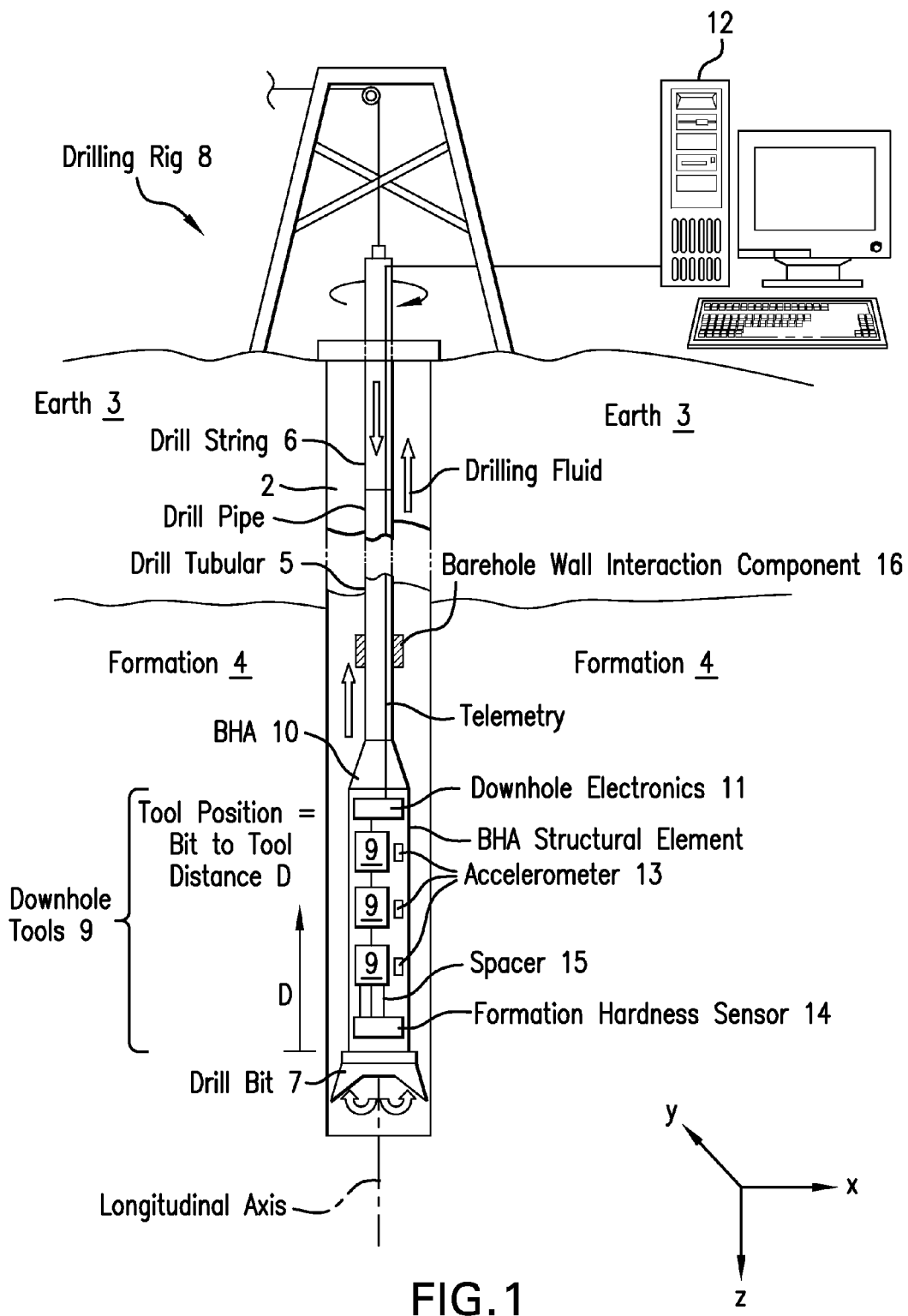
FIG. 1 illustrates a cross-sectional view of an exemplary embodiment of a drill string having a bottomhole assembly (BHA) disposed in a borehole penetrating the earth.

FIG. 1 illustrates a cross-sectional view of an exemplary embodiment of a drill tubular 5 having a bottomhole assembly (BHA) 10 and disposed in a borehole 2 penetrating the earth 3. The earth 3 may include an earth formation 4, which may represent any subsurface material of interest that the borehole 2 may traverse. The drill tubular 5 in the embodiment of FIG. 1 is a string of coupled drill pipes referred to as a drill string 6. Disposed at the distal end of the drill string 6 is the BHA 10. The drill tubular 5 includes a drill bit 7 disposed at the end of the drill tubular 5. The drill bit 7 is configured to be rotated by the drill tubular 5 to drill the borehole 2. The BHA 10 may include the drill bit 7 as illustrated in FIG. 1 or it may be separate from the BHA 10. A drill rig 8 is configured to conduct drilling operations such as rotating the drill string 6 and thus the drill bit 7 in order to drill the borehole 2. In addition, the drill rig 8 is configured to pump drilling fluid through the drill string 6 in order to lubricate the drill bit 7 and flush cuttings from the borehole 2. A mud motor (not shown) configured to provide further rotational energy to the drill bit 7 may also be included in the BHA 10. In the embodiment of FIG. 1, the drill tubular 5 includes a borehole wall interaction component 16 that is configured to interact with or contact a wall of the borehole 2. Non-limiting examples of the borehole wall interaction component 16 are a drill tubular stabilizer configured to stabilize or limit lateral motion of the drill tubular 5 within the borehole 2 or a reamer configured to widen the borehole 2. As the drill tubular 5 may include a BHA, a drill bit, and/or a borehole wall interaction device, the term "drill tubular" may be inclusive of these components.

The BHA 10 in FIG. 1 is configured to contain or support a plurality of downhole tools 9. In one or more embodiments, the downhole tools 9 are spaced apart or secured by a spacer 15 having a certain length. The downhole tools 9 represent any tools that perform a function downhole while drilling is being conducted or during temporary halt in drilling. In one or more embodiments, the function represents sensing of formation or borehole properties, which may include caliper of borehole, temperature, pressure, gamma-rays, neutrons, formation density, formation porosity, resistivity, dielectric constant, chemical element content, and acoustic resistivity, as non-limiting embodiments. In one or more embodiments, the downhole tools 9 include a formation tester configured to extract a formation fluid sample for surface or downhole analysis and/or to determine the formation pressure. In one or more embodiments, the downhole tools 9 may include a geo-steering device configured to steer the direction of drilling. The downhole tools 9 may include one or more accelerometers 13 that are configured to sense acceleration or vibration. In general, one or more accelerometers 13 may be located at each downhole tool 9 or corresponding position in order to sense the vibration experienced by the corresponding downhole tool 9. In one or more embodiments, the downhole tools 9 include a formation hardness sensor 14. The formation hardness sensor 14 may be a gamma-ray detector configured to detect gamma-rays emitted by the formation 4. Generally, a gamma-ray count rate below a certain threshold may be indicative of a hard formation, which when interacting with a drill bit may cause high frequency torsional oscillations (HFTO). Alternatively, the formation hardness sensor 14 may be a bulk density sensor. Generally, a formation having a bulk density above a certain threshold may be indicative of a hard formation, which when interacting with a drill bit may cause high frequency torsional oscillations.

Downhole electronics 11 may be configured to operate one or more tools in the plurality of downhole tools 9, process measurement data obtained downhole, and/or act as an interface with telemetry to communicate measurement data or commands between downhole components and a computer processing system 12 disposed at the surface of the earth 3. Non-limiting embodiments of the telemetry include pulsed-mud and wired drill pipe. System operation and data processing operations may be performed by the downhole electronics 11, the computer processing system 12, or a combination thereof. A processor such as in the computer processing system 12 may be used to implement the teachings disclosed herein.

Figure 2:
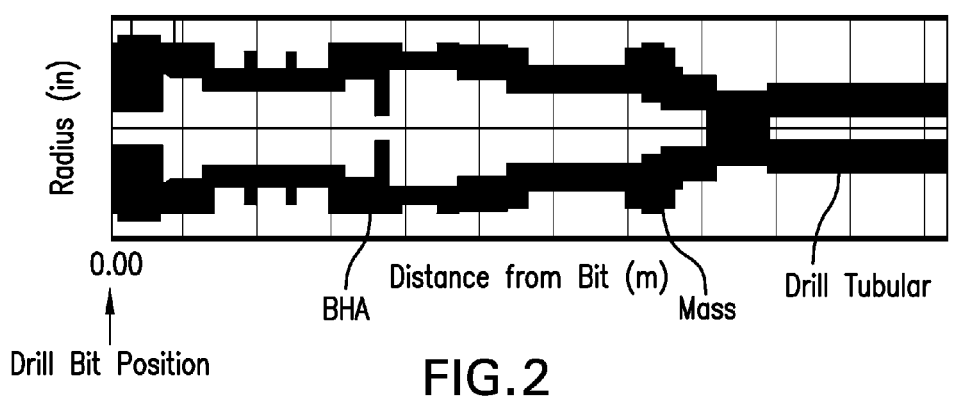
FIG. 2 depicts aspects of one example of a mathematical model of the drill tubular having the BHA.

The method disclosed herein calls for constructing a mathematical model of the drill tubular, the BHA portion of the drill tubular, and other components that may be coupled to the drill tubular. In one or more embodiments, the drill tubular is modeled as a finite-element network such as would be obtained using a computer-aided-design (CAD) software package. Non-limiting embodiments of the CAD software are Solid Works, ProEngineer, AutoCAD, and CATIA. The model may be a three-dimensional model, a two-dimensional model, or a one dimensional model (i.e., modeling just torsional vibration, just axial vibration, or just lateral vibration). The model includes a geometry of the drill tubular and material properties of the drill tubular such as density (e.g., to give weight distribution), stiffness (e.g., to determine flex), and/or damping characteristic. The stiffness data may include elasticity and/or Poison's Ratio. It can be appreciated that if a tool or component is configured to be a structural part of the drill tubular, then the tool or component will be modeled as part of the drill tubular. The model may also include geometry of the borehole so that external forces imposed on the drill tubular from contact with a borehole wall can be determined. The geometry may be determined from a drilling plan or from a borehole caliper tool, which may be one of the downhole tools 9. FIG. 2 illustrates one example of a mathematical model of the drill tubular having a BHA.

Once a mathematical model of the drill tubular and BHA is constructed, the method calls for calculating motion of the drill tubular and BHA using an equation of motion. The equation of motion of the drill tubular and BHA may be written as:

$$M\ddot{x} + C\dot{x} + Kx = f$$

where M is the mass matrix representing the mass of the drill tubular and the BHA, K is the stiffness matrix representing the stiffness of the drill tubular and the BHA, C is the damping matrix representing the damping response of the drill tubular and the BHA or other drill tubular components, x is the vector of physical amplitudes of motion of the drill tubular and BHA, and f is the vector of external excitation forces applied to the drill tubular and the BHA. The single dot represents the first derivative with respect to time and the double dots represent the second derivative with respect to time. This equation of motion of the drill tubular and BHA may be written in the modal domain as:

$$I\ddot{q} + D\dot{q} + \Lambda q = \Phi^T f$$

applying the transformation $x = \Phi q$ where $\Phi$ is the mass normalized modal matrix such that $\Phi^T M \Phi = I$ (T represents transpose of matrix) and q is the vector of modal amplitudes. I, D and $\Lambda$ are the modal mass matrix or unity matrix, the modal damping matrix, and the spectral matrix containing eigenvalues of the system, respectively. $\Phi^T f$ can be denoted as the modal excitation vector, which relates the vector of external excitation forces applied to the drill string and the BHA in the modal domain. The equation of motion in the modal domain may be diagonalized and described as:

$$\mathrm{diag}(\ddot{q}_i + 2D_i \omega_{0,i} \dot{q}_i + \omega_{0,i}^2 q_i) = \Phi^T f$$

Herein, $D_i$ and $\omega_{0,i}$ are the modal damping factor and the angular eigenfrequency of the i-th mode, respectively.

Figure 3:
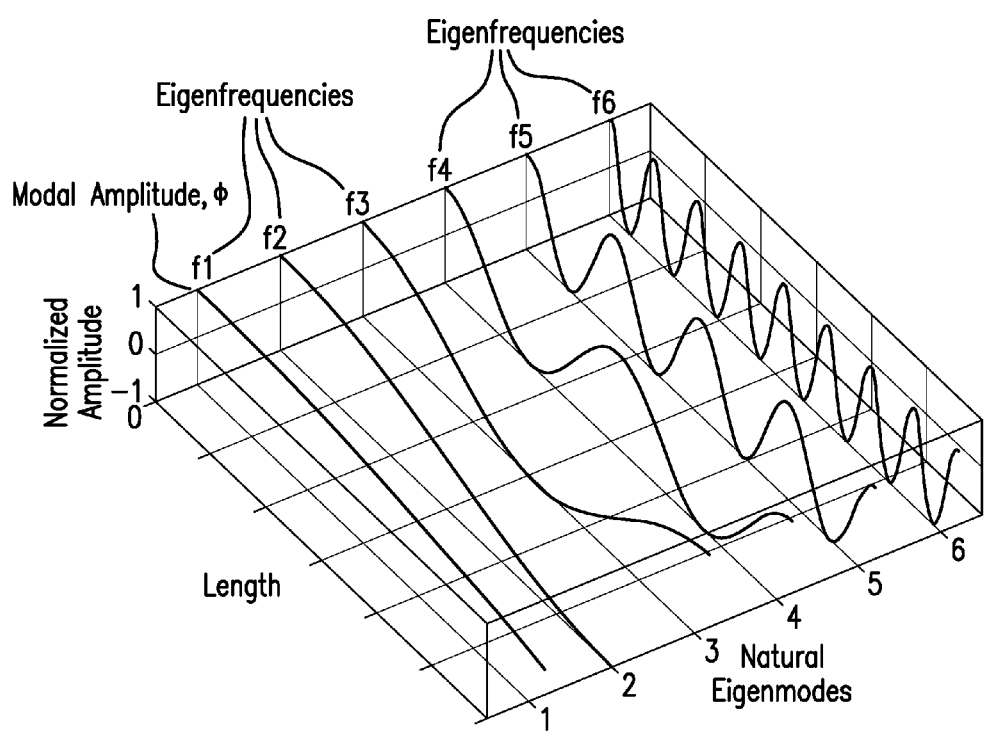
FIG. 3 depicts aspects of eigenmodes and eigenfrequencies for a torsional beam.

The physical interpretation of the modal domain is that it represents the frequencies (i.e., eigenfrequencies) and corresponding mode shapes (i.e., eigenmodes) relating to the free vibration of the drill tubular. At the eigenfrequencies, the drill tubular is more susceptible to excitation forces that cause the vibrations. Forces imposed on the drill bit by interactions of the drill tubular with formation rock such as by the cutting action of the drill bit may be referred to as self-excitation. FIG. 3 is a three-dimensional plot illustrating the six first natural eigenmodes and eigenfrequencies ($f_1$, $f_2$, $f_3$, $f_4$, $f_5$, and $f_6$) of a simple structure (i.e., a torsional beam) of length L. Each natural eigenmode corresponds to a different natural frequency (i.e., eigenfrequency). Each natural eigenmode has a distinctive shape (i.e., mode shape) with different locations of nodes (where response curve has zero amplitude) and anti-nodes (where response curve has maximum amplitude either positive or negative relative to adjacent portions). It can be appreciated that at a node the torque experienced by the drill tubular is a maximum relative to regions adjacent to the node. In order for there to be zero amplitude at the node, the drill tubular experiences a torque of sufficient magnitude to resist torsional movement while regions adjacent to the node experience less torque resulting in some amplitude of movement. For clarification purposes, there are torque maxima in the tubular, but the internal torque may not provide support against an external fixed frame. In the equation of motion in the modal domain, the vector of modal amplitudes q is analogous to the vector of physical amplitudes of motion x in the physical domain. The vector q has the unknown variables that need to be solved for in order to determine the vibration amplitudes of the drill tubular. The mass normalized model matrix Φ is needed for the transformation into the modal domain and is obtained by solving the eigen-value problem a-priori to obtain the eigen-frequencies and eigenmodes. These eigen-values may be determined in one or more embodiments using finite element analysis of the finite element model of the drill tubular and a drill bit force model of forces imposed on the drill bit while cutting formation rock using a math-solving computer program. Alternatively or in addition, these eigen-values may be determined by experiment using the specific drill tubular of interest or similar drill tubular. The drill bit force model may include formation hardness as input in order to model the drill bit cutting forces. The formation hardness may be obtained from a previously drilled borehole or from the formation hardness sensor 14. The drill bit force model may be determined by testing the drill bit being used or a similar drill bit, by analysis, or by a combination thereof. In addition, other models of forces imposed on the drill tubular, such as by impacts against the borehole wall, may be incorporated into the equation of motion. Once the modal domain equation of motion is obtained, this equation may be solved using a commercially available math-solving computer program to obtain q.

Assuming only one mode contributes to the vibrations (for simplicity of the mathematical derivation, but not limited to this assumption), the equation of motion written as:

$$\ddot{q}_i + 2D_i\omega_{0,i}\dot{q}_i + \omega_{0,i}^2 q_i = \varphi_i^T f$$

Assuming the last degree of freedom is the torsional degree of freedom of the drill bit, the physical excitation force vector may be written as:

$$f = [f_1 f_2 \ldots f_{bit}]^T.$$

Note that forces and torques are not distinguished in this context. If excitation forces and/or torques exist only at the drill bit, that is $f_1 = f_2 = \ldots = f_{n-1} = 0$ and $f_n$=force and/or torque at the drill bit, then the modal force of the i-th mode shape may be written as:

$$\varphi_i^T f = [\varphi_{1,i} \varphi_{2,i} \ldots \varphi_{bit,i}][00 \ldots f_{bit}]^T = \varphi_{bit,i} f_{bit}.$$

This leads to the equation of motion for modal amplitude $q_i$ of one mode shape $\varphi_{bit,i}$ being written as:

$$\ddot{q}_i + 2D_i\omega_{0,i}\dot{q}_i + \omega_{0,i}^2 q_i = \varphi_{bit,i} f_{bit}$$

where the product $\varphi_{bit,i} f_{bit}$ is the modal force.

The physical degrees of freedom of the drill string-BHA structure can be described as:

$$x = \Phi q = [\varphi_1 \varphi_2 \ldots \varphi_m][q_1 q_2 \ldots q_m]^T.$$

It is assumed that the cutting forces and modal amplitudes of one mode shape are not influenced by other mode shapes, which applies for a fully linearized model in general. This is true if the self-excitation tends to localize in one mode, which has been proven by observations from field tests.

Figure 4:
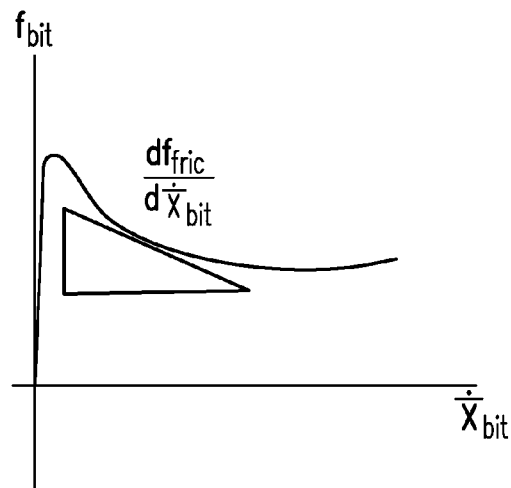
FIG. 4 depicts aspects of a falling characteristic of cutting forces or torque at a drill bit with regard to angular speed.

The physical forces at the drill bit may be described by a falling or declining characteristic of the aggressiveness (related to amount of rock removed) with which the drill bit drills into formation rock with each revolution. (One interpretation of aggressiveness (μ) is μ=c*TOB/WOB where c is a constant, TOB is torque-on-bit and WOB is weight-on-bit. A falling or declining characteristic of μ generally results in a falling characteristic of $f_{bit}$, if the WOB does not change significantly. This latter dependency is covered by the following equation.) The force acting on the drill bit may be described as:

$$f_{bit} = \frac{df_{fric}}{d\dot{x}_{bit}} \dot{x}_{bit} = \frac{df_{fric}}{d\dot{x}_{bit}} \varphi_{bit,i} \dot{q}_i$$

where $$\frac{df_{fric}}{d\dot{x}_{bit}}$$

is the slope of the falling friction force with regard to a constant rotational speed (rpm) or angular velocity $\bar{\dot{x}}_{bit}$ of the drill string or drill bit as illustrated in FIG. 4. This falling characteristic of aggressiveness has been observed in several field tests. Note that the equation of motion and the cutting forces are linearized with respect to a constant angular velocity $\bar{\dot{x}}_{bit}$ of the drill bit. It can be noted that $\dot{x}_{bit} = \varphi_{bit,i} \dot{q}_i$ if only one mode is excited. Thus, the equation of motion for one mode shape can be written as:

$$\ddot{q}_i + 2D_i\omega_{0,i}\dot{q}_i + \omega_{0,i}^2 q_i = \varphi_{bit,i} f_{bit} = \frac{df_{fric}}{d\dot{x}_{bit}} \varphi_{bit,i}^2 \dot{q}_i.$$

The parts of this equation of motion, which are proportional to the velocity, can be combined to an effective damping factor. The criterion for positive or effective damping is:

$$2D_i\omega_{0,i} > \frac{df_{fric}}{d\dot{x}_{bit}} \varphi_{bit,i}^2.$$

This relation can also be used to define a limit for the slope of the falling aggressiveness characteristic or friction forces of the drill bit with respect to angular velocity by being rewritten as:

$$\frac{df_{fric}}{d\dot{x}_{bit}} < \frac{2D_i\omega_{0,i}}{\varphi_{bit,i}^2}.$$

This relation may be further rewritten for the modal damping $D_i$ needed to avoid self-excitation for mode i as:

$$D_i > \frac{df_{fric}}{d\dot{x}_{bit}} \frac{\varphi_{bit,i}^2}{2\omega_{0,i}}.$$

Interpreting the results of these equations, the system (i.e., drill string and BHA) is more prone to self-excitation if the modal damping factor $D_i$ is lower, if the slope of the velocity dependent cutting forces $$\frac{df_{fric}}{d\dot{x}_{bit}}$$

is higher, if the angular eigenfrequency $\omega_{0,i}$ is lower, and if the mode shape has a higher value $\varphi_{bit,i}$ at the drill bit. Since the latter contributes quadratically, it has a very high impact on the stability (or system vibrations) of the system.

Figure 5:
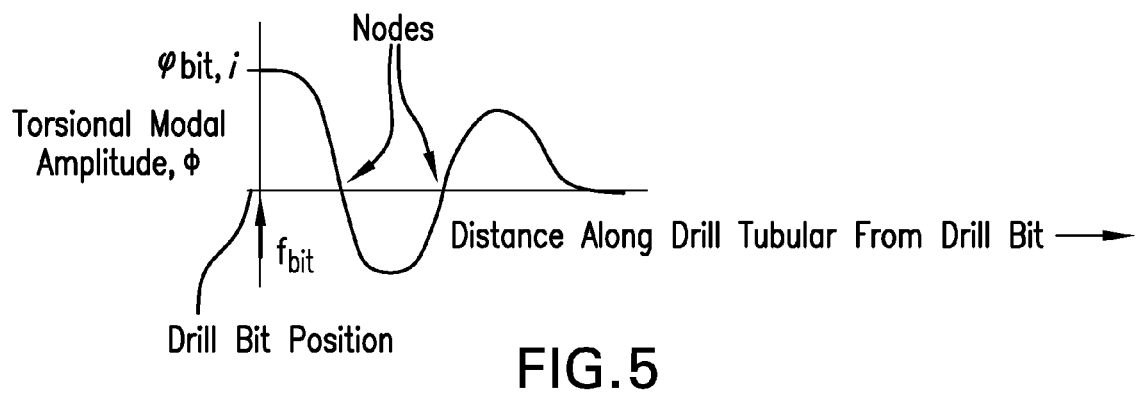
FIG. 5 depicts aspects of an exemplary torsional mode shape of the drill string.

FIG. 5 depicts aspects of an exemplary torsional mode shape of the drill string starting at the drill bit and proceeding longitudinally along the BHA and drill tubular. In FIG. 5, a mode shape is depicted that has a comparably high deflection $\varphi_{bit,i}$ at the drill bit. Any force or torque (torsional direction) acting on the drill bit is therefore able to excite the system. Regarding the equation for the modal force $\varphi_{bit,i}f_{bit}$, a zero deflection $\varphi_{bit,i}=0$ would prevent excitation of the mode shape.

Recapitulating, self-excitation of a specific mode shape $\varphi_i$ with a specific angular eigenfrequency $\omega_{0,i}$ and modal damping factor $D_i$ caused by velocity dependent $$\frac{df_{fric}}{d\dot{x}_{bit}} < 0$$

cutting forces (see FIG. 4) at the drill bit can be avoided. The resulting condition for no self-excitation, $$D_i > \frac{df_{fric}}{d\dot{x}_{bit}} \frac{\varphi_{bit,i}^2}{2\omega_{0,i}},$$

can be interpreted to provide the following criteria to avoid or limit vibrations resulting from self-excitation.

Increase the modal damping $D_i$ of the observed mode to avoid self-excitation of the mode shape. Modal damping may also be increased by increasing the deflection of the mode shape in areas with high material damping (e.g., if rubber is deformed) or where friction contacts, such as at high amplitudes, dissipate energy.

Reduce the slope $$\frac{df_{fric}}{d\dot{x}_{bit}}$$

of the falling friction characteristic. The slope is dependent on the formation, drilling fluid or mud, and drill bit properties.

Increase the angular eigenfrequency $\omega_{0,i}$ of the mode to reduce the risk of self-excitation as defined above. This is dependent on the mass and stiffness distribution along the BHA (e.g., reducing masses and increasing stiffness).

Due to the quadratic contribution, the drill bit deflection described by the mode shape factor $\varphi_{bit,i}^2$ has the highest influence on the described condition. Changing mass and stiffness distribution can reduce this deflection. This may compete with the goal to increase the eigenfrequency.

Mathematically, the above criteria can be described by maximizing the distance of the effective damping to the regime of self-excitation for all significant mode shapes as follows:

$$F(M + \Delta M, C + \Delta C, K + \Delta K, \text{bit}) = \text{Max} \sum_{i=1}^{n} D_i - \frac{df_{fric}}{d\dot{x}_{bit}} \frac{\varphi_{bit,i}^2}{2\omega_{0,i}}.$$

Herein, F is a function of the manipulating stiffness $\Delta K$ (i.e., change in stiffness due to manipulation), damping $\Delta C$ (i.e., change in damping due to manipulation), and mass $\Delta M$ (i.e., change in mass due to manipulation) matrices added to the system and also of the properties of the drill bit.

The constraint $$D_i - \frac{df_{fric}}{d\dot{x}_{bit}} \frac{\varphi_{bit,i}^2}{2\omega_{0,i}} \geq D_i^*$$

for $i=1 \ldots n$ prohibits self-excitation if $D_i^* \geq 0$. $D_i^*$ should be selected to be greater than zero to have a security or margin factor. Another constraint might be necessary to limit the additional mass $\Delta m_j \leq \Delta \overline{m}_j$ and stiffness $\Delta k_j \leq \Delta \overline{k}_j$ as a function of the place j where it is applied to account for limitations such as arising from design or spatial considerations. The bar over $\Delta m$ and $\Delta k$ above represents an upper limit.

The above optimization problem can be solved by intuitively changing mass and stiffness distribution along the drill tubular or with an optimization algorithm such as Nelder-Mead is a non-limiting embodiment.

Figure 6:
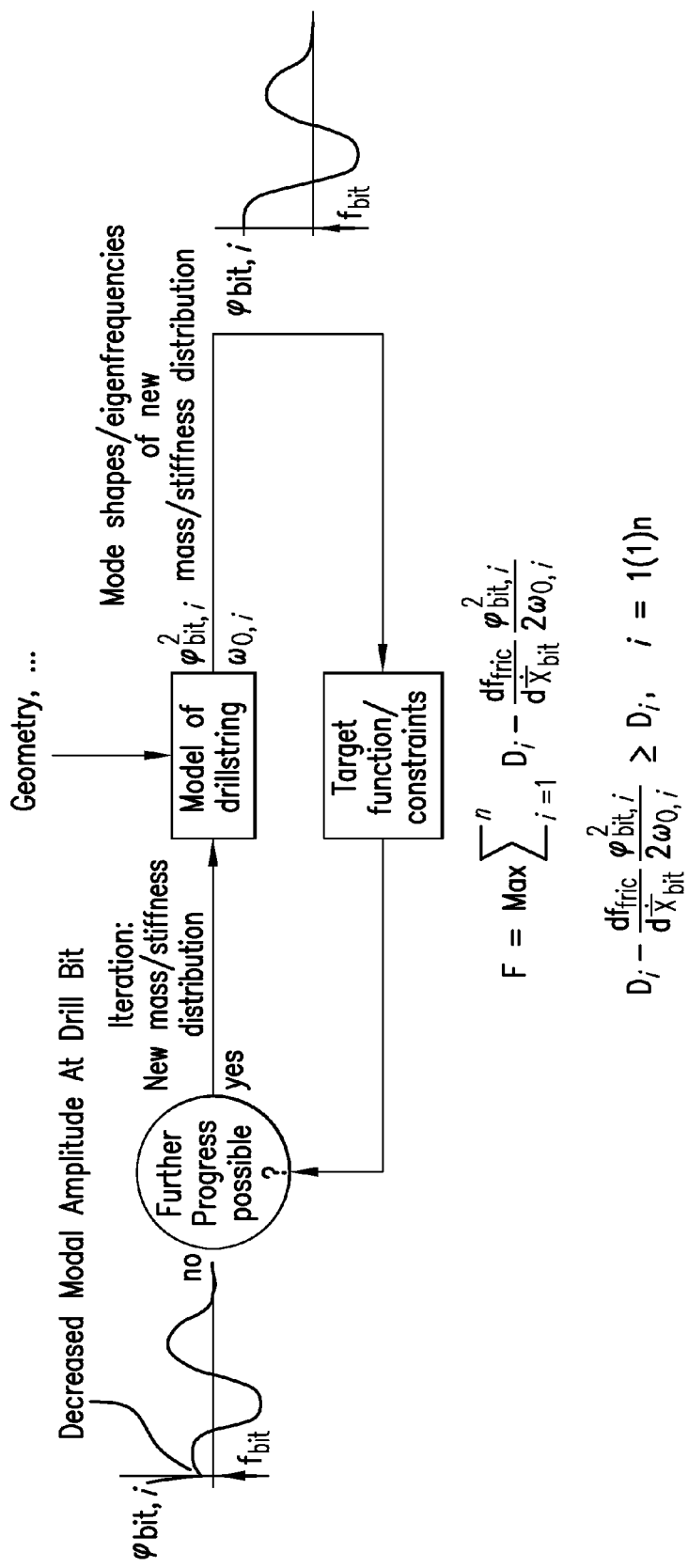
FIG. 6 depicts aspects of optimization of mode shapes and eigenfrequencies to avoid self-excitation.

FIG. 6 depicts aspects of an exemplary process for optimization of mode shapes and eigenfrequencies to avoid or limit self-excitation. The initial mode shape is illustrated at the right side of FIG. 6. The initial mode shape is calculated by applying a modal transform to equations of motion as determined from a model of the drill tubular and BHA where the model includes mass distribution and material stiffness (i.e., resistance to deflection) properties. Target functions and constraints are applied to the modal equations of motion to determine where and how much change in mass distribution and/or material stiffness should occur. Then, at a decision point, it is determined if further progress in modifying the mass distribution and/or material stiffness is possible. The criteria for this decision may be based on design factors such as the size (e.g., diameter and length) of the BHA and drill tubular. For example, the length and diameter of the BHA may be fixed such that positions of downhole tools and sizes of structural materials in the BHA may be constrained, thus, preventing further modifications of these parameters. If it is determined that further modifications are possible, then modifications are made within any design or spatial constraints and a new mathematical model of the modified drill tubular is constructed. The new mathematical model is then analyzed using modal analysis to determine the magnitude of vibrations that the drill tubular and any downhole components or tools may be subject to. When further modifications are no longer possible within predetermined constraints, then the process is stopped at the decision point. The left side of FIG. 6 illustrates the amplitudes of vibration of the drill tubular for one mode after the final modification. It is seen that the torsional modal amplitude at the drill bit is reduced from the original torsional modal amplitude at the drill bit as shown on the right side of FIG. 6.

Figure 7:
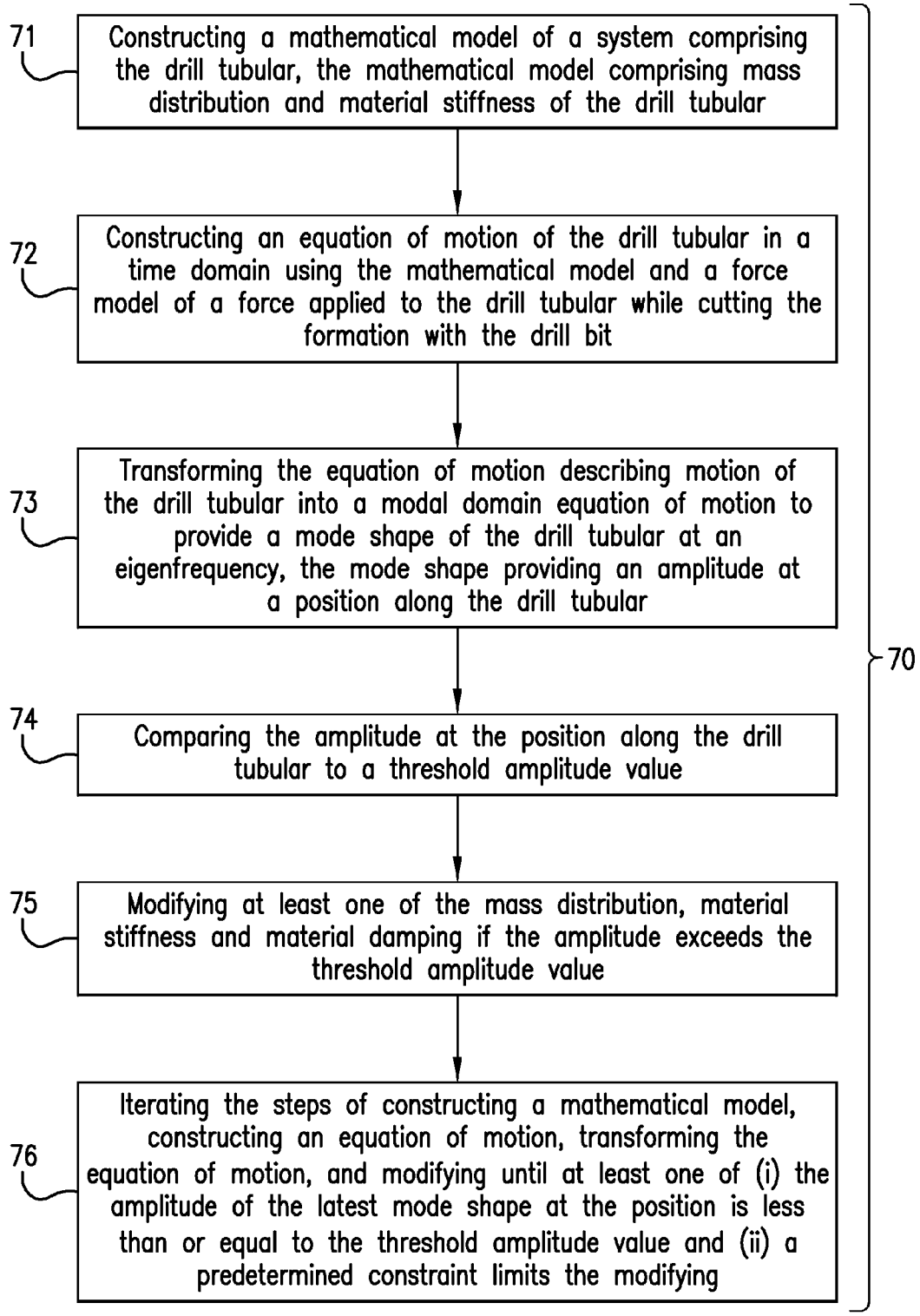
FIG. 7 is a flow chart of a method for reducing vibrations of a drill string.

FIG. 7 is a flow chart for a method 70 for reducing vibrations in a drill tubular coupled to a drill bit configured to drill a borehole in a formation. The vibrations may be torsional, axial, and/or lateral with respect to the longitudinal axis of the drill tubular. Block 71 calls for constructing a mathematical model of a system comprising the drill tubular. The mathematical model may include mass distribution, material stiffness and material damping of the drill tubular. The drill tubular may be inclusive of a BHA and/or a borehole wall interaction component. The system may also include the drill tubular being within the borehole and constrained by borehole geometry. Block 72 calls for constructing an equation of motion of the drill tubular in a time domain or a frequency domain using the mathematical model and a force model of a force applied to the drill tubular while cutting the formation with the drill bit. In one or more embodiments, the force model includes a drill bit force model describing forces imposed on the drill bit as the drill bit cuts the formation during drilling, The drill bit force model may include the characteristic of declining aggressiveness of drilling or cutting. The force model may include the characteristic of declining aggressiveness of drilling or cutting where this characteristic is exhibited by a sum of forces imposed on the drill tubular. In the sum of forces, one or more forces in the sum may not exhibit the characteristic of declining aggressiveness. Alternatively, the sum of forces may also include a sum of forces where all the forces exhibit the characteristic of declining aggressiveness such as the sum of individual forces acting on a plurality of cutters in a drill bit for example. In one or more embodiments, the force model may include a borehole wall force model of a force imposed on the drill tubular due to an interaction between the drill tubular and a wall of the borehole. The borehole wall force model may be determined by analysis, using data from downhole sensors, and/or from laboratory testing. In one or more embodiments, the equation of motion of the drill tubular may include motion of the drill tubular in the drilling fluid and material damping takes into account damping of the drill tubular due to an interaction between the drill tubular and the drilling fluid. Block 73 calls for transforming the equation of motion describing motion of the drill tubular into a modal domain equation of motion to provide a mode shape of the drill tubular at an eigenfrequency. The mode shape provides an amplitude at one or more positions along the drill tubular. Block 74 calls for comparing the amplitude at the position along the drill tubular to a threshold amplitude value. The threshold amplitude may be a vibration rating related to an acceleration to which the drill tubular and downhole components and tools are rated for operation. The threshold amplitude may determined by analysis and/or testing. Block 75 calls for modifying at least one of the mass distribution, the material stiffness, and the material damping if the amplitude exceeds the threshold amplitude value. Modifying the mass distribution may include relocating one or more downhole tools by changing the distance D (see FIG. 1) of the one or more tools from the drill bit such as by inserting one or more spacers between tools. Modifying the material stiffness may include increasing the thickness of a structural member or changing the type of material of the structural member to have a more suitable stiffness. Modifying material damping may include substituting one material for another material having a different damping factor. In one or more embodiments, the force model has a declining characteristic of aggressiveness with respect to rotational speed of the drill tubular and modifying includes increasing a rotational speed of the drill bit in order to reduce the vibrations. Block 76 calls for iterating the steps of constructing a mathematical model, constructing an equation of motion, transforming the equation of motion, and modifying until the amplitude of the latest mode shape at the position is less than or equal to the threshold amplitude value. The method 70 may also include determining if further modifications are possible within a certain constraint such as a design or spatial constraint and terminating the iterating if no further modifications are possible with the certain constraint. In one or more embodiments, the constraint is a spatial constraint, which is determined by one or more dimensions of the drill tubular and BHA or drill collar and any downhole tools or components that may be housed by the BHA or drill collar. The method 70 may further include searching for maxima of a difference between $D_i$ on the left side and the product on the right side of the relation, $$D_i > \frac{df_{fric}}{d\dot{x}_{bit}} \frac{\varphi_{bit,i}^2}{2\omega_{0,i}},$$

in order to obtain one or more critical mode shapes. The critical mode shapes provide maximum margin to avoid self-excitation leading to damaging vibrations of the drill tubular.

The above disclosed techniques provide several advantages. One advantage is that the techniques provide for increasing the reliability of downhole tools or components by reducing vibration levels to which the tools and components may be subjected. The techniques are also economical compared to the alternative of trial and error during field operations. It can be appreciated that, when the BHA includes one or more accelerometers, the measured accelerations can be compared to the predicted accelerations as a validation or quality check of the techniques.

In support of the teachings herein, various analysis components may be used, including a digital and/or an analog system. For example, the downhole electronics 11, the computer processing system 12, or the sensor system 9 may include digital and/or analog systems. The system may have components such as a processor, storage media, memory, input, output, communications link (wired, wireless, pulsed mud, optical or other), user interfaces, software programs, signal processors (digital or analog) and other such components (such as resistors, capacitors, inductors and others) to provide for operation and analyses of the apparatus and methods disclosed herein in any of several manners well-appreciated in the art. It is considered that these teachings may be, but need not be, implemented in conjunction with a set of computer executable instructions stored on a non-transitory computer readable medium, including memory (ROMs, RAMs), optical (CD-ROMs), or magnetic (disks, hard drives), or any other type that when executed causes a computer to implement the method of the present invention. These instructions may provide for equipment operation, control, data collection and analysis and other functions deemed relevant by a system designer, owner, user or other such personnel, in addition to the functions described in this disclosure.

Elements of the embodiments have been introduced with either the articles "a" or "an." The articles are intended to mean that there are one or more of the elements. The terms "including" and "having" are intended to be inclusive such that there may be additional elements other than the elements listed. The conjunction "or" when used with a list of at least two terms is intended to mean any term or combination of terms. The term "coupled" relates to a first component being coupled to a second component either directly or indirectly via an intermediary component.

While one or more embodiments have been shown and described, modifications and substitutions may be made thereto without departing from the spirit and scope of the invention. Accordingly, it is to be understood that the present invention has been described by way of illustrations and not limitation.

It will be recognized that the various components or technologies may provide certain necessary or beneficial functionality or features. Accordingly, these functions and features as may be needed in support of the appended claims and variations thereof, are recognized as being inherently included as a part of the teachings herein and a part of the invention disclosed.

While the invention has been described with reference to exemplary embodiments, it will be understood that various changes may be made and equivalents may be substituted for elements thereof without departing from the scope of the invention. In addition, many modifications will be appreciated to adapt a particular instrument, situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing vibrations in a drill tubular coupled to a drill bit configured to drill a borehole in a formation, the method comprising:

constructing a mathematical model of a system comprising the drill tubular, the mathematical model comprising mass distribution, material stiffness, and material damping;

constructing an equation of motion of the drill tubular in one of a time domain and frequency domain using the mathematical model and a force model of a force applied to the drill tubular while cutting the formation with the drill bit;

transforming the equation of motion describing motion of the drill tubular into a modal domain equation of motion to provide a mode shape of the drill tubular at an eigenfrequency, the mode shape providing an amplitude at a position along the drill tubular;

comparing the amplitude at the position along the drill tubular to a threshold amplitude value;

modifying at least one of the mass distribution, material stiffness, and material damping if the amplitude exceeds the threshold amplitude value;

iterating the steps of constructing a mathematical model, constructing an equation of motion, transforming the equation of motion, and modifying until at least one of (i) the amplitude of the latest mode shape at the position is less than or equal to the threshold amplitude value and (ii) a predetermined constraint limits the modifying; and physically modifying the drill tubular to achieve the at least one of the mass distribution, material stiffness, and material damping used in an ending iteration;

wherein the equation of motion is of the form $M\ddot{x}+C\dot{x}+Kx=f$ where M is the mass matrix representing the mass of the drill tubular, K is the stiffness matrix representing the stiffness of the drill tubular, C is the damping matrix representing a damping response of the drill tubular, x is the vector of physical amplitudes of motion of the drill tubular and bottomhole assembly (BHA), and f is the vector of external excitation forces applied to the drill tubular;

wherein transforming comprises applying the transform $x=\Phi q$ where $\Phi$ is the normalized mass modal matrix such that $\Phi^T M \Phi = I$ and q is the vector of modal amplitudes and the modal domain equation of motion is of the form $I\ddot{q}+D\dot{q}+\Lambda q=\Phi^T f$ where I, D, and $\Lambda$ are the normalized mass modal matrix, the modal damping matrix, and the spectral matrix containing eigenvalues of the system, respectively;

wherein the modal domain equation of motion for the i-th mode is described as:

$$\ddot{q}_i + 2D_i\omega_{0,i}\dot{q}_i + \omega_{0,i}^2 q_i = \varphi_{bit,i} f_{bit}$$

where $D_i$ and $\omega_{0,i}$ are the modal damping factor and the angular eigenfrequency of the i-th mode, respectively, and the product $\varphi_{bit,i} f_{bit}$ the bit force in the modal domain, and $\varphi_{bit,i}$ is the amplitude in the modal domain; the method further comprising stopping the iterating when $$D_i > \frac{df_{fric}}{d\dot{x}_{bit}} \frac{\varphi_{bit,i}^2}{2\omega_{0,i}}$$

and where $$\frac{df_{fric}}{d\dot{x}_{bit}}$$

represents a change in frictional forces imposed on the drill tubular with respect to a change in rotational velocity of the drill tubular and has a negative slope.

2. The method according to claim 1, wherein the vibrations are at least one of torsional vibrations, axial vibrations, and lateral vibrations.

3. The method according to claim 1, wherein the system further comprises the drill tubular disposed in drilling fluid in the borehole.

4. The method according to claim 1, wherein the drill tubular comprises at least one of a bottomhole assembly (BHA) and a borehole wall interaction component configured to contact a wall of the borehole.

5. The method according to claim 1, wherein the force model comprises a borehole wall force model of a force imposed on the drill tubular due to an interaction between the drill tubular and a wall of the borehole.

6. The method according to claim 1, wherein the force model comprises a sum of forces imposed on the drill tubular, the sum of forces comprising a declining characteristic of aggressiveness with respect to rotational speed of the drill tubular.

7. The method according to claim 1, wherein the force model comprises a drill bit force model of a force applied to the drill bit while the drill bit is cutting the formation.

8. The method according to claim 7, wherein the drill bit force model comprises a declining characteristic of aggressiveness.

9. The method according to claim 1, wherein the force model comprises a declining characteristic of aggressiveness with respect to rotational speed of the drill tubular and modifying comprises changing a rotational speed of the drill bit in order to reduce the vibrations.

10. The method according to claim 1, wherein the drill tubular comprises a bottomhole assembly (BHA) having one or more downhole tools and modifying comprises placing in the BHA the one or more downhole tools to a new location.

11. The method according to claim 1, wherein the predetermined constraint is based on a spatial limitation of the drill tubular.

12. The method according to claim 1, wherein the effective damping criterion comprises at least one of an eigenfrequency, a deflection, a modal damping, and a force model.

13. The method according to claim 12, wherein modifying comprises changing the modal damping of the drill tubular.

14. The method according to claim 12, wherein modifying comprises increasing the eigenfrequency.

15. The method according to claim 12, wherein modifying comprises reducing deflection of the drill bit.

16. The method according to claim 12, wherein the effective damping criterion comprises a derivative of the force model.

17. The method according to claim 16, further comprising using the effective damping criterion to define a limit for the derivative of the force model.

18. A method for reducing vibrations in a drill tubular coupled to a drill bit configured to drill a borehole in a formation, the method comprising:
constructing a mathematical model of a system comprising the drill tubular, the mathematical model comprising mass distribution, material stiffness and material damping;
constructing an equation of motion of the drill tubular in one of a time domain and frequency domain using the mathematical model and a force model of a force applied to the drill tubular while cutting the formation with the drill bit;
transforming the equation of motion describing motion of the drill tubular into a modal domain equation of motion to provide a mode shape of the drill tubular at an eigenfrequency, the mode shape providing an amplitude at a position along the drill tubular;
comparing the amplitude at the position along the drill tubular to a threshold amplitude value;
modifying at least one of the mass distribution, material stiffness and material damping if the amplitude exceeds the threshold amplitude value;
iterating the steps of constructing a mathematical model, constructing an equation of motion, transforming the equation of motion, and modifying until at least one of (i) the amplitude of the latest mode shape at the position is less than or equal to the threshold amplitude value and (ii) a predetermined constraint limits the modifying; and
physically modifying the drill tubular to achieve the at least one of the mass distribution, material stiffness, and material damping used in an ending iteration;
wherein the equation of motion is of the form $M\ddot{x}+C\dot{x}+Kx=f$ where M is the mass matrix representing the mass of the drill tubular, K is the stiffness matrix representing the stiffness of the drill tubular, C is the damping matrix representing a damping response of the drill tubular, x is the vector of physical amplitudes of motion of the drill tubular and bottomhole assembly (BHA), and f is the vector of external excitation forces applied to the drill tubular;
wherein transforming comprises applying the transform $x=\Phi q$ where $\Phi$ is the normalized mass modal matrix such that $\Phi^T M\Phi=I$ and q is the vector of modal amplitudes and the modal domain equation of motion is of the form $I\ddot{q}+D\dot{q}+\nabla q=\Phi^T f$ where I, D, and $\Lambda$ are the normalized mass modal matrix, the modal damping matrix, and the spectral matrix containing eigenvalues of the system, respectively;
wherein the modal domain equation of motion for the i-th mode is described as:

$$\ddot{q}_i + 2D_i\omega_{0,i}\dot{q}_i + \omega_{0,i}^2 q_i = \varphi_{bit,i} f_{bit}$$

where $D_i$ and $\varphi_{0,i}$ are the modal damping factor and the angular eigenfrequency of the i-th mode, respectively, and the product $\varphi_{bit,i} f_{bit}$ is the bit force in the modal domain, and $\varphi_{bit,i}$ is the amplitude in the modal domain;
the method, further comprising stopping the iterating when $$D_i - \frac{df_{fric}}{d\dot{x}_{bit}} \frac{\varphi_{bit,i}^2}{2\omega_{0,i}} \geq D_i^*$$

for i=1 ... n and $D^*_i \geq 0$ and where $$\frac{df_{fric}}{d\dot{x}_{bit}}$$

represents a change in frictional forces imposed on the drill tubular with respect to a change in rotational velocity of the drill tubular and has a negative slope.

19. A method for reducing vibrations in a drill tubular coupled to a drill bit configured to drill a borehole in a formation, the method comprising:
constructing a mathematical model of a system comprising the drill tubular, the mathematical model comprising mass distribution, material stiffness and material damping;
constructing an equation of motion of the drill tubular in one of a time domain and frequency domain using the mathematical model and a force model of a force applied to the drill tubular while cutting the formation with the drill bit;
transforming the equation of motion describing motion of the drill tubular into a modal domain equation of motion to provide a mode shape of the drill tubular at an eigenfrequency, the mode shape providing an amplitude at a position along the drill tubular;
comparing the amplitude at the position along the drill tubular to a threshold amplitude value;
modifying at least one of the mass distribution, material stiffness and material damping if the amplitude exceeds the threshold amplitude value;
iterating the steps of constructing a mathematical model, constructing an equation of motion, transforming the equation of motion, and modifying until at least one of (i) the amplitude of the latest mode shape at the position is less than or equal to the threshold amplitude value and (ii) a predetermined constraint limits the modifying; and
physically modifying the drill tubular to achieve the at least one of the mass distribution, material stiffness, and material damping used in an ending iteration;
wherein the equation of motion is of the form $M\ddot{x}+C\dot{x}+Kx=f$ where M is the mass matrix representing the mass of the drill tubular, K is the stiffness matrix representing the stiffness of the drill tubular, C is the damping matrix representing a damping response of the drill tubular, x is the vector of physical amplitudes of motion of the drill tubular and bottomhole assembly (BHA), and f is the vector of external excitation forces applied to the drill tubular;
wherein transforming comprises applying the transform $x=\Phi q$ where $\Phi$ is the normalized mass modal matrix such that $\Phi^T M\Omega=I$ and q is the vector of modal amplitudes and the modal domain equation of motion is of the form $I\ddot{q}+D\dot{q}+\Lambda q=\Phi^T f$ where I, D, and $\Lambda$ are the normalized mass modal matrix, the modal damping matrix, and the spectral matrix containing eigenvalues of the system, respectively;

wherein the modal domain equation of motion for the i-th mode is described as:

$$\ddot{q}_i + 2D_i\omega_{0,i}\dot{q}_i + \omega_{0,i}^2 q_i = \varphi_{bit,i} f_{bit}$$

where $D_i$ and $\varphi_{0,i}$ are the modal damping factor and the angular eigenfrequency of the i-th mode, respectively, and the product $\varphi_{bit,i} f_{bit}$ is the bit force in the modal domain, and $\varphi_{bit,i}$ is the amplitude in the modal domain;

the method further comprising searching for local maxima of a difference between $D_i$ on the left side and the product on the right side of the relation, $$D_i > \frac{df_{fric}}{d\dot{x}_{bit}} \frac{\varphi_{bit,i}^2}{2\omega_{0,i}},$$

in order to obtain one or more critical mode shapes.

* * * * *